United States Patent
Huang

(10) Patent No.: US 11,269,001 B2
(45) Date of Patent: Mar. 8, 2022

(54) MONITORING DEVICE FOR MONITORING AN ARC DISCHARGE IN A DRY ETCHING MACHINE CONFIGURED TO DRY-ETCH A DISPLAY PANEL, ELECTROSTATIC CHUCK OF THE DRY-ETCHING MACHINE, AND MONITORING METHOD OF THE MONITORING DEVICE

(71) Applicant: HKC Corporation Limited, Shenzhen (CN)

(72) Inventor: Bei Zhou Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 516 days.

(21) Appl. No.: 16/313,135

(22) PCT Filed: Oct. 22, 2018

(86) PCT No.: PCT/CN2018/111199
§ 371 (c)(1),
(2) Date: Dec. 25, 2018

(87) PCT Pub. No.: WO2020/051979
PCT Pub. Date: Mar. 19, 2020

(65) Prior Publication Data
US 2021/0223304 A1    Jul. 22, 2021

(30) Foreign Application Priority Data
Sep. 11, 2018 (CN) .......................... 201811055007.8

(51) Int. Cl.
*G01R 31/12* (2020.01)
*G01R 1/04* (2006.01)

(52) U.S. Cl.
CPC ........... *G01R 31/1218* (2013.01); *G01R 1/04* (2013.01)

(58) Field of Classification Search
CPC ....... H01L 2924/3025; H01L 21/67103; H01L 21/67109; H01L 21/67703; H01L 21/6831; G01N 23/225; G01N 23/2251; H01J 37/222; H01J 37/244; H01J 37/28; H01J 2237/2002; H01J 2237/2007;
(Continued)

(56) References Cited

U.S. PATENT DOCUMENTS 7,030,335 B2 * 4/2006 Hoffman ........... H01J 37/32082
118/723 I
8,289,029 B2 * 10/2012 Coumou ................ G01R 31/00
324/536
(Continued)

FOREIGN PATENT DOCUMENTS

CN    102788916 A  * 11/2012 ........ H01J 37/32944
CN    102788916 A    11/2012
(Continued)

OTHER PUBLICATIONS

Yanqin Li, the ISA written comments, Jun. 2019, CN.

*Primary Examiner* — Vinh P Nguyen

(57) ABSTRACT

The present application discloses a monitoring device, an electrostatic chuck and a monitoring method. the monitoring device includes a box body, a monitoring circuit, and a signal processing circuit. A view window is provided on the box body. The signal processing circuit is configured to process a signal transmitted by the monitoring circuit.

15 Claims, 3 Drawing Sheets

(58) Field of Classification Search
CPC ....... H01J 2237/0635; H01J 2237/2446; H01J 2237/24485; H01J 37/3174; H01J 37/32174; H01J 37/32944; H01J 2237/0206; H01J 37/32935; G01R 31/1218; G01R 31/00; G01R 1/04; G06T 2207/10048; G06T 7/0004; G06T 7/292; G06F 3/04845; G06F 3/0488; G01J 2005/0077; G01J 5/02; G01J 5/04; G01D 21/02

See application file for complete search history.

(56) References Cited

U.S. PATENT DOCUMENTS

| | | | |
|---|---|---|---|
| 8,855,949 B2 * | 10/2014 | Nonomura | H01J 37/32935 |
| | | | 702/57 |
| 9,543,171 B2 * | 1/2017 | Waldmann | H01L 21/67109 |
| 10,170,287 B1 * | 1/2019 | Wu | H01J 37/32183 |
| 10,436,717 B2 * | 10/2019 | Omstead | G01J 3/443 |
| 2011/0005682 A1 * | 1/2011 | Savas | C23C 16/45504 |
| | | | 156/345.34 |

FOREIGN PATENT DOCUMENTS

| | | |
|---|---|---|
| CN | ON104793072 A | 7/2015 |
| CN | 106206234 A | 12/2016 |
| CN | 106992497 A | 7/2017 |
| CN | 206905909 U | 1/2018 |
| JP | 05179467 A | 7/1993 |

* cited by examiner

MONITORING DEVICE FOR MONITORING AN ARC DISCHARGE IN A DRY ETCHING MACHINE CONFIGURED TO DRY-ETCH A DISPLAY PANEL, ELECTROSTATIC CHUCK OF THE DRY-ETCHING MACHINE, AND MONITORING METHOD OF THE MONITORING DEVICE

The present application claims priority to the Chinese Patent Application No. CN201811055007.8, filed to the Chinese Patent Office on Sep. 11, 2018, and entitled "MONITORING DEVICE, ELECTROSTATIC CHUCK AND MONITORING METHOD", which is incorporated herein by reference in its entirety.

TECHNICAL FIELD

The present application relates to the technical field of display, and in particular, to a monitoring device, an electrostatic chuck and a monitoring method.

BACKGROUND

It should be understood that the statements herein merely provide background information related to the present application, and do not necessarily constitute the prior art.

A display with active switch control includes a liquid crystal display, an Organic Light-Emitting Diode (OLED) display, etc. The liquid crystal display has many advantages such as thin body, power-saving, and no radiation, and thus has been widely used. Most of the liquid crystal displays known to the inventors are backlight liquid crystal displays, which include a liquid crystal panel and a backlight module. The working principle of the liquid crystal panel is to place liquid crystal molecules in two parallel glass substrates, and apply a driving voltage on the two glass substrates to control the rotation direction of the liquid crystal molecules to refract the light of the backlight module to generate a picture. The OLED display, also known as an organic electroluminescent display, has many advantages such as self-illumination, short response time, high definition and contrast, flexible display and large-area full-color display, and its superior performance and huge market potential have attracted many manufacturers and scientific research institutions all over the world to invest in the production and research and development of OLED display panels.

During the production process of a dry-etching machine, due to the quality problems or the introduction of foreign matters into an Electrostatic Chuck (ESC) arc discharge of a monitoring device, ESC damage, partial burn of the glass, and back scratch of the glass are caused. After a current alarm, the condition inside a box body is observed with naked eyes through a view window.

However, the naked eye has a narrow field of view, low viewing angle, and low illumination, which may cause misjudgment and subsequent running, may cause product abnormalities.

SUMMARY

In view of the foregoing defects of the prior art, the technical problem to be solved by the present application is to provide a monitoring device, an ESC, and a monitoring method.

To achieve the foregoing objective, the present application provides a monitoring device, including: a box body on which a view window is provided, the monitoring device including:

a monitoring circuit, configured to monitor arc discharge in the box body in real time; and a signal processing circuit, configured to process a signal transmitted by the monitoring circuit, and determine whether abnormal arc discharge occurs.

Optionally, the monitoring circuit includes an infrared thermal imager and a monitoring probe; the monitoring probe is provided at the view window, and is electrically connected to the infrared thermal imager and the infrared thermal imager is electrically connected to the signal processing circuit.

Optionally, the box body is rectangular, there are two monitoring probes; and the monitoring probes are located at the box body diagonally.

Optionally, the box body is rectangular; there are four monitoring probes that are provided corresponding to four corners of the box body, respectively.

Optionally, the monitoring circuit includes a visible light camera; the visible light camera is provided at the view window, and is electrically connected to the signal processing circuit.

Optionally, the box body includes four side plates; the four side plates include a first side plate, a second side plate, a third side plate, and a fourth side plate; the four side plates are connected end to end; the first side plate is provided with three view windows distributed uniformly; the third side plate is provided with three view windows distributed uniformly, the fourth side plate has a rectangular groove that penetrates through the fourth side plate; the second side plate is opposite to the fourth side plate, and is provided with two view windows.

Optionally, the monitoring probes are located on opposite side plates.

The two view windows are provided diagonally, to completely cover the entire box body.

The present application further discloses a monitoring method for the foregoing monitoring device, including:

setting an alarm value;

collecting a detected signal in a box body using a monitoring circuit; and processing the detected signal using a signal processing circuit, and comparing with the alarm value to determine whether abnormal arc discharge occurs.

Optionally, the alarm value is a temperature value; the detected signal is a temperature signal; and an alarm is sent if the temperature signal reaches the temperature value.

Optionally, the monitoring circuit includes an infrared thermal imager and a monitoring probe; after the step of collecting a detected signal in a box body using a monitoring circuit, the method further includes: generating a thermogram after the infrared thermal imager captures a signal of the monitoring probe.

Optionally, after the step of processing the detected signal using a signal processing circuit, and comparing with the alarm value to determine whether abnormal arc discharge occurs, the method further includes:

shutting down, and determining an abnormal position.

The inventor's research found that an exemplary machine has no monitoring device. After the product is alarmed, the condition inside a box body is observed with naked eyes through view windows. Due to the narrow field of view, low viewing angle and low illumination, it is easy to cause misjudgment and affect the subsequent running. A monitoring device is provided to replace visual observation and monitors in real time, and thus, it is not easy to misjudge.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings.

DETAILED DESCRIPTION

Figure 1:
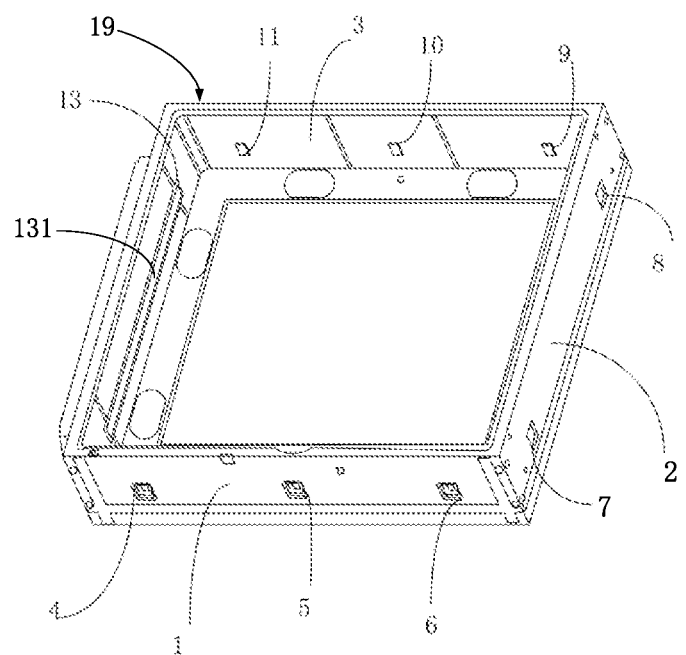
FIG. 1 is a schematic diagram of a monitoring device according to an embodiment of the present application.

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying a relative importance, or implicitly indicating the number of the indicated technical features. Hence, the features defined by "first" and "second" can explicitly or implicitly include one or more features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or electrically connected; or directly connected or indirectly connected through an intermediate medium, or in an internal communication between two elements. The specific meanings about the foregoing terms in the present application may be understood by those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

The present application are further described below with reference to the accompanying drawings and preferred embodiments.

Figure 2:
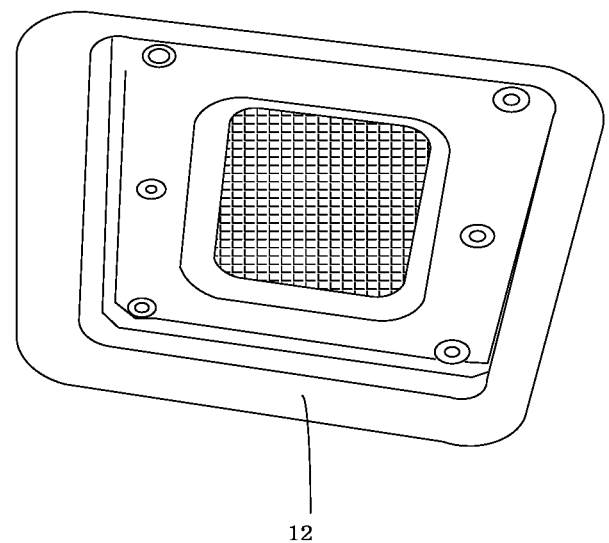
FIG. 2 is an enlarged schematic diagram of a view window of a box body of the monitoring device according to an embodiment of the present application.
Figure 3:
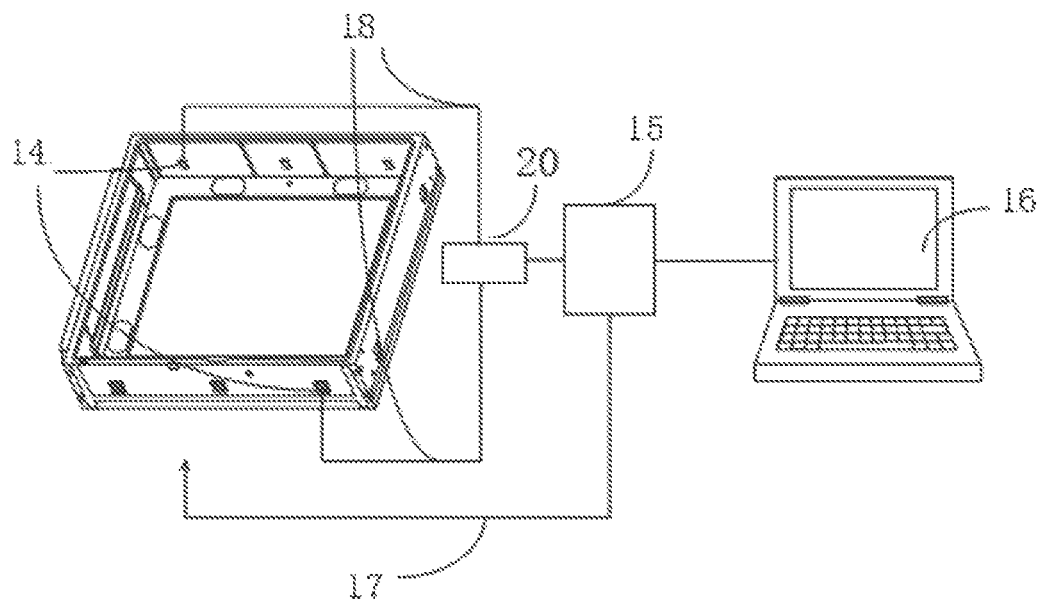
FIG. 3 is a schematic diagram of a monitoring device according to another embodiment of the present application.

As shown in FIGS. 1-3, an embodiment of the present application discloses a monitoring device, including:

a box body 19 on which a view window is provided, the monitoring device including:

a monitoring circuit, configured to monitor arc discharge in the box body 19 in real time; and a signal processing circuit, configured to process a signal transmitted by the monitoring circuit, and determine whether abnormal arc discharge occurs.

The monitoring circuit includes an infrared thermal imager and a monitoring probe 14; the box body 19 is rectangular; there are two monitoring probes 14; and the monitoring probes 14 are located at the box body diagonally.

The box body 19 includes four side plates; the four side plates include a first side plate 1, a second side plate 2, a third side plate 3, and a fourth side plate 13; the four side plates are connected end to end; the first side plate 1 is provided with three view windows distributed uniformly; the second side plate 2 is opposite to the fourth side plate 13, and is provided with two view windows; the fourth side plate 13 has a rectangular groove 131 that penetrates through the fourth side plate 13; the third side plate 3 is provided with three view windows distributed uniformly; the view windows are first to eighth view windows in an anti-clockwise direction in sequence; and the monitoring probes 14 are located at the third view window 6 and the eighth view window 11

A traditional dry-etching machine has no monitoring device. After the product is alarmed, the condition inside a box body 19 is observed with naked eyes through view windows. Due to the narrow field of view, low viewing angle and low illumination, it is easy to cause misjudgment and affect the subsequent running. A monitoring device is provided to replace visual observation and monitors in real time, and thus, it is not easy to misjudge.

As another embodiment of the present application, with reference to FIGS. 1-3, a monitoring device, including:

a box body 19 on which a view window is provided, the monitoring device including:

a monitoring circuit, configured to monitor arc discharge in the box body in real time; and a signal processing circuit, configured to process a signal transmitted by the monitoring circuit, and determine whether abnormal arc discharge occurs.

A traditional dry-etching machine has no monitoring device. After the product is alarmed, the condition inside a box body 19 is observed with naked eyes through view windows. Due to the narrow field of view, low viewing angle and low illumination, it is easy to cause misjudgment and affect the subsequent running. A monitoring device is provided to replace visual observation and monitors in real time, and thus, it is not easy to misjudge.

Optionally, in this embodiment, the monitoring circuit includes an infrared thermal imager and a monitoring probe 14; the monitoring probe 14 is provided at the view window, and is electrically connected to the infrared thermal imager 20; the infrared thermal imager is electrically connected to the signal processing circuit 15; and a processing result is fed back to a computer 16 for display.

During the production process of machines, due to the quality problems or the introduction of foreign matters, the ESC arc discharge is triggered, resulting in that the quality of the product is abnormal. When the product is arc-discharged, it will generate a high temperature of thousands of degrees Celsius. Adding the infrared thermal imager and the monitoring probe 14 can monitor the temperature inside the box body in real time.

Optionally, in this embodiment, the box body is rectangular; there are two monitoring probes 14; and the monitoring probes 14 are located at the box body diagonally.

The infrared thermal imager is provided with monitoring probes to monitor the temperature in the box body 19; and at least two monitoring probes 14 are needed to monitor the box body according to the coverage. Two monitoring probes 14 are provided diagonally so that the viewing angles of the monitoring probes 14 cover the entire box body 19. Two monitoring probes 14 are more economical from a cost perspective.

Optionally, in this embodiment, the box body is rectangular; there are four monitoring probes that are provided corresponding to four corners of the box body, respectively.

Optionally, in this embodiment, the monitoring circuit includes a visible light camera; the visible light camera is provided at the view window, and is electrically connected to the signal processing circuit.

Optionally, in this embodiment, the four side plates include a first side plate 1, a second side plate 2, a third side plate 3, and a fourth side plate 13; the four side plates are connected end to end; the first side plate 1 is provided with three view windows distributed uniformly; the second side plate 2 is opposite to the fourth side plate 13, and is provided with two view windows; the fourth side plate 13 has a rectangular groove 131 that penetrates through the fourth side plate 13; the third side plate 3 is provided with three view windows distributed uniformly; the view windows are first to eighth view windows in an anti-clockwise direction in sequence; and the monitoring probes are located at the third view window 6 and the eighth view window 11.

The view windows around the box body 19 observe the machine production process in the box body 19. The eight view windows are respectively located on the first, second and third side plates to facilitate observing and monitoring from all angles.

Optionally, in this embodiment, the monitoring probes 14 are located at the third view window 6 and the eighth view window 11.

The monitoring probes are located at the third view window 6 and the eighth view window 11 that are provided diagonally to completely cover the entire box body.

Figure 4:
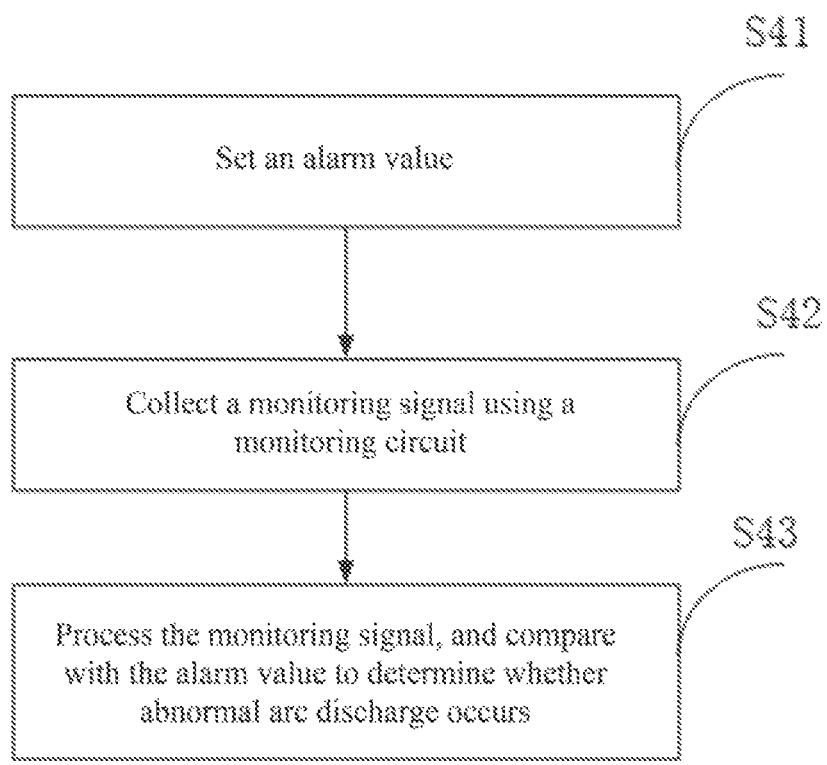
FIG. 4 is a schematic diagram of a monitoring method for the monitoring device according to another embodiment of the present application.

As another embodiment of the present application, with reference to FIGS. 3 and 4, disclosed is a monitoring method including the foregoing monitoring device, including:

S41: Set an alarm value.

S42: Collect a detected signal in a box body using a monitoring circuit.

S43: Process the detected signal using a signal processing circuit, and compare with the alarm value to determine whether abnormal arc discharge occurs.

The monitoring device sets an alarm value and collects a detected signal in a box body using a monitoring circuit; moreover, the signal processing circuit processes the detected signal, compares the collected detected signal with the alarm value, and determines whether abnormal arc discharge occurs according to a comparison result.

Optionally, in this embodiment, the alarm value is a temperature value; the detected signal is a temperature signal; and an alarm is sent if the temperature signal reaches the temperature value.

High temperature is generated if are discharge occurs in the production of machines; and an alarm is sent when the temperature reaches or exceeds the alarm value, and monitoring is made in real time.

Optionally, in this embodiment, the monitoring circuit includes an infrared thermal imager and a monitoring probe 14; after the step of collecting a detected signal in a box body using a monitoring circuit, the method further includes: generating a thermogram alter the infrared thermal imager captures a signal of the monitoring probe 14.

A thermogram is generated after the infrared thermal imager captures a signal to visually and vividly observe the position where arc discharge occurs, and it is visual and vivid.

Optionally, in this embodiment, after the step of processing the monitoring signal using a signal processing circuit, and comparing with the alarm value to determine whether abnormal arc discharge occurs, the method further includes: shutting down, and determining an abnormal position.

After an abnormity occurs, shut down while determining the occurrence of arc discharge and sending an alarm and the position where the arc discharge occurs is found according to the thermogram and is recorded.

Figure 5:
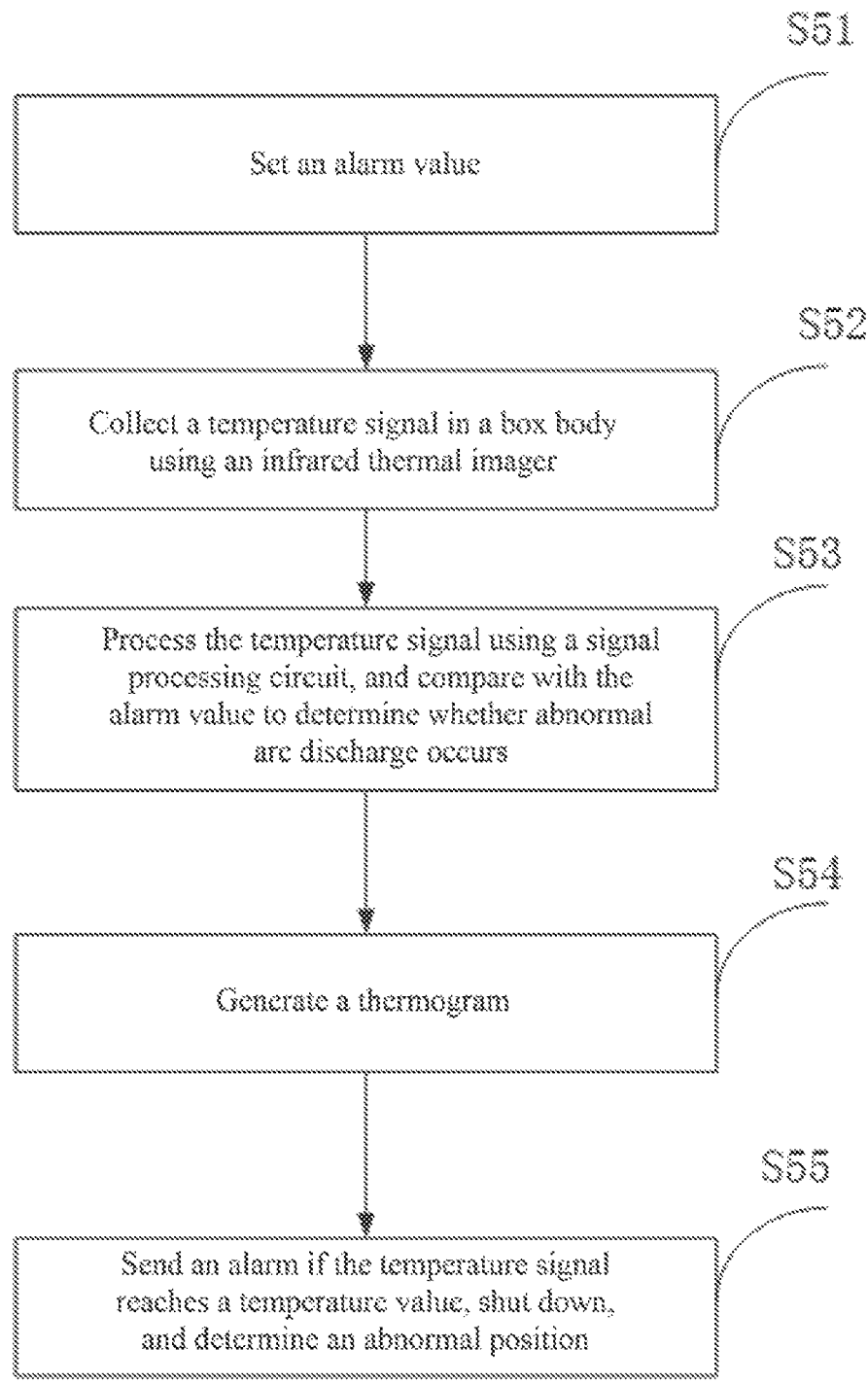
FIG. 5 is a schematic diagram of a monitoring method for the monitoring device according to yet another embodiment of the present application.

As another embodiment of the present application, with reference to FIGS. 3 and 5, disclosed is a monitoring method including the foregoing monitoring device, including:

S51: Set an alarm value.

S52: Collect a temperature signal in a box body using an infrared thermal imager.

S53: Process the temperature signal using a signal processing circuit, and compare with the alarm value to determine whether abnormal arc discharge occurs.

S54: Generate a thermogram.

S55: Send an alarm if the temperature signal reaches a temperature value, shut down, and determine an abnormal position.

The monitoring device sets an alarm value, collects a temperature signal in a box body using an infrared thermal imager. Moreover, the signal processing circuit processes the temperature signal, compares the collected temperature signal with the alarm value, and determines whether abnormal arc discharge occurs according to a comparison result. After an abnormity occurs, shut down while determining the occurrence of arc discharge and sending an alarm and the position where the arc discharge occurs is found according to the thermogram and is recorded.

The panel in the present application may be a Twisted Nematic (TN) panel, an In-Plane Switching (IPS) panel, and a Multi-domain Vertical Alignment (VA) panel, and of course, may also be other types of panels, if appropriate.

The contents above are further detailed descriptions of the present application in conjunction with specific preferred embodiments, and the specific implementation of the present application is not limited to these descriptions. It will be apparent to a person of ordinary skill in the art that various simple deductions or substitutions may be made without departing from the spirit of the present application, and should be considered to be within the scope of protection of the present application.

What is claimed is:

1. A monitoring device for monitoring the occurrence of an arc discharge in a box body of a dry-etching machine configured to dry-etch a display panel, the box body comprising at least one view window, the monitoring device comprising:
   a monitoring circuit, configured to monitor the occurrence of an arc discharge in the box body in real time; and
   a signal processing circuit, configured to process a signal transmitted by the monitoring circuit, and determine whether an abnormal arc discharge occurs;
   wherein the monitoring circuit comprises an infrared thermal imager and at least one monitoring probe, wherein the at least one monitoring probe is arranged at the at least one view window and electrically connected to the infrared thermal imager, and the infrared thermal imager is electrically connected to the signal processing circuit.

2. The monitoring device according to claim 1, wherein the box body is rectangular; the at least one monitoring probe comprises two monitoring probes, which are diagonally disposed at the box body.

3. The monitoring device according to claim 1, wherein the box body is rectangular; the at least one monitoring probe comprises four monitoring probes, which are disposed corresponding to four corners of the box body, respectively.

4. The monitoring device according to claim 1, wherein the box body comprises four side plates; the four side plates comprise a first side plate, a second side plate, a third side plate, and a fourth side plate; the four side plates are connected end to end, and the second side plate is disposed opposite to the fourth side plate; wherein the at least one view window comprises three view windows that are defined in and are uniformly distributed along the first side plate, three view windows that are defined in and are uniformly distributed along the third side plate, and two view windows that are defined in the second side plate; wherein the fourth side plate comprises a rectangular groove that penetrates through the fourth side plate.

5. The monitoring device according to claim 2, wherein the monitoring probes are located on opposite side plates.

6. A monitoring method of the monitoring device according to claim 1, comprising:
   setting, by a computer coupled to the monitoring device, an alarm value;
   collecting, by the monitoring circuit, a detected signal in relation to the occurrence of the arc discharge in the box body; and
   processing the detected signal using a signal processing circuit, and comparing the detected signal against the alarm value and determining whether an abnormal arc discharge occurs.

7. The monitoring method according to claim 6, wherein the alarm value is a temperature value; the detected signal is a temperature signal; and an alarm is sent in the case in which the temperature signal reaches the temperature value.

8. The monitoring method according to claim 7, after the step of collecting the detected signal in the box body using the monitoring circuit, the method further comprises: generating a thermogram after the infrared thermal imager captures a signal of the monitoring probe.

9. The monitoring method according to claim 8, wherein after the step of processing the detected signal using the signal processing circuit, and comparing the detected signal against the alarm value and determining whether the abnormal arc discharge occurs, the method further comprises:
   shutting down the dry-etching machine, and determining an abnormal position.

10. An electrostatic chuck of a dry-etching machine configured to dry-etch a display panel, wherein the dry-etching machine comprises a box body configured to receive the display panel and a monitoring device configured for monitoring the occurrence of an arc discharge in the box body, wherein the box body comprises at least one view window defined in a sidewall of the box body, and the monitoring device comprises:
   a monitoring circuit, configured to monitor the occurrence of an arc discharge in the box body in real time; and
   a signal processing circuit, configured to process a signal transmitted by the monitoring circuit, and determine whether an abnormal arc discharge occurs;
   wherein the monitoring circuit comprises an infrared thermal imager and at least one monitoring probe, wherein the at least one monitoring probe is arranged at the at least one view window and electrically connected to the infrared thermal imager, and the infrared thermal imager is electrically connected to the signal processing circuit.

11. The electrostatic chuck according to claim 10, wherein the box body is rectangular; the at least one monitoring probe comprises two monitoring probes, which are diagonally disposed at the box body.

12. The electrostatic chuck according to claim 10, wherein the box body is rectangular; at least one monitoring probe comprises four monitoring probes, which are disposed corresponding to four corners of the box body, respectively.

13. The electrostatic chuck according to claim 10, wherein the monitoring circuit further comprises at least one visible light camera, which is arranged at the at least one view window and is electrically connected to the signal processing circuit.

14. The electrostatic chuck according to claim 10, wherein the box body comprises four side plates; the four side plates comprise a first side plate, a second side plate, a third side plate, and a fourth side plate; the four side plates are connected end to end, and the second side plate is disposed opposite to the fourth side plate; wherein the at least one view window comprises three view windows that are defined in and are uniformly distributed along the first side plate, three view windows that are defined in and are uniformly distributed along the third side plate, and two view windows that are defined in the second side plate; wherein the fourth side plate comprises a rectangular groove that penetrates through the fourth side plate.

15. The electrostatic chuck according to claim 14, wherein the monitoring probes are disposed on opposite side plates.

* * * * *